United States Patent [19]
Nishida et al.

[11] Patent Number: 6,036,908
[45] Date of Patent: Mar. 14, 2000

[54] INJECTION MOLDING METHOD FOR RESIN-SEALED COMPONENT

[75] Inventors: Hirotoshi Nishida, 1340, Mizoguchi, Geihoku-cho, Yamaga-gun, Hiroshima-ken; Yoshimi Ohno, Hiroshima-ken, both of Japan

[73] Assignees: Kabushiki Kaisha Ohno; Hirotoshi Nishida, both of Hiroshima-ken, Japan

[21] Appl. No.: 08/947,857

[22] Filed: Oct. 9, 1997

[30] Foreign Application Priority Data

Nov. 19, 1996 [JP] Japan ................................. 8-324591

[51] Int. Cl.[7] ............................. B29C 45/14; B29C 70/70
[52] U.S. Cl. .................. 264/254; 264/272.11; 264/297.3
[58] Field of Search ................................ 264/255, 328.8, 264/297.2, 297.3, 328.11, 250, 254, 271.1, 272.11; 425/116, 129.1, 129.2, 130, 134

[56] References Cited

U.S. PATENT DOCUMENTS

| | | |
|---|---|---|
| 2,377,393 | 6/1945 | Wiley . |
| 2,465,799 | 3/1949 | Gravesen . |
| 2,940,128 | 6/1960 | Bowerman et al. .................... 264/254 |
| 4,052,499 | 10/1977 | Goupil et al. ........................... 264/265 |
| 4,831,719 | 5/1989 | Tsai ............................................ 29/622 |
| 4,885,121 | 12/1989 | Patel ......................................... 264/255 |
| 5,020,215 | 6/1991 | Tsai ............................................ 29/622 |
| 5,030,406 | 7/1991 | Sorensen ................................. 264/255 |
| 5,256,048 | 10/1993 | Jacobs et al. ........................... 425/130 |
| 5,419,864 | 5/1995 | Sheer et al. ............................. 264/254 |

FOREIGN PATENT DOCUMENTS

| | | |
|---|---|---|
| 2-38377 | 8/1990 | Japan . |
| 6-49307 | 6/1994 | Japan . |

Primary Examiner—Angela Ortiz
Attorney, Agent, or Firm—Kanesaka & Takeuchi

[57] ABSTRACT

An injection molding die is provided with a cavity block including a stationary mold having first and second split molding cavity portions having different shapes, and a movable mold having first and second common split molding cavity portions, so as to form first and second molding cavities between the stationary and movable molds in mold clamping. Each time a molding shot is performed, a component part to be sealed is inserted while a primary molded piece formed in the first molding cavity is transferred to the second molding cavity and a secondary molded piece formed in the second molding cavity is removed. Thus, the first and second molded pieces can be simultaneously produced.

2 Claims, 9 Drawing Sheets

INJECTION MOLDING METHOD FOR RESIN-SEALED COMPONENT

BACKGROUND OF THE INVENTION

1. Field of the Invention

This invention relates to an injection molding method for producing a packaged molded article by completely sealing a sheet-like component part such as a printed-circuit board with resin material.

2. Description of the Prior Art

In recent years, there have been supplied sheet-like indicators such as a resonant tag which is made by printing a resonant circuit (LC) on a printed board (including a flexible substrate). Under certain circumstances, a sheet-like indicator completely sealed with resin material has been needed according to usage, but a conventional indicator airtightly sealed is insufficient.

An airtight-sealing method and a resin-sealing method for sealing or enclosing semiconductor elements have been conventionally known. These sealing methods principally serve to protect or secure the semiconductor elements onto a printed board. In general, a low-pressure transfer molding method which may be deemed as an insert molding method has been adopted as the sealing method.

Incidentally, there has been so far known a laminated injection molding technique (including a molding die) adopting an insert molding method or a multi-material and multi-color molding method for completely sealing a monolithic component.

For example, Japanese Patent Publication No. HEI 6-49307(B2) discloses a two-layer injection molding method using a molding die which comprises a stationary mold, a movable mold, and a slidable mold mounted between the stationary mold and movable mold. The slidable mold is provided with first and second cavities, so that upon molding a central core primary molded piece) in the first cavity in primary molding, the slide mold is transferred for performing secondary molding in the second cavity without removing the central core molded in the first cavity, thus to form a surface layer around the central core. This prior art injection molding method makes it possible to continuously produce molded articles having the central core sealed in the surface layer formed secondarily in the second cavity.

That is, in the conventional molding method mentioned above, the primary molded piece formed in the slide mold in the primary molding is subjected to the secondary molding in the same slide mold without being removed from the slide mold. Accordingly, it is difficult for this conventional molding method to completely seal, with resin material, another component part such as a printed-circuit board to be given from the outside of the slide mold and inserted in the second cavity when carrying out the secondary molding. Thus, the conventional molding method is unable to easily produce molded articles (secondary molded pieces) sealed with resin material.

Also in Japanese Patent Publication No. HEI 2-38377 (B2), there is disclosed a molding method for producing hollow molded articles, in which a slide mold is moved in a molding die so that primary molding is performed at a first position and secondary molding is performed at a second position. This prior art does not describe or in any way hint at a resin-sealing technique.

OBJECT OF THE INVENTION

This invention has been made in the light of the foregoing conventional circumstances and has an object to provide an injection molding method capable of continuously producing, at a high yield rate, packaged molded articles completely sealed with resin material in which component parts such as printed-circuit boards are enclosed.

SUMMARY OF THE INVENTION

According to the present invention, there is provided an injection molding method for producing resin-sealed articles in which a sheet-like component part such as a printed-circuit board is packaged by use of a pair of split molds forming a first cavity for primary molding and a second cavity for secondary molding, comprising placing, opposite to an injection unit, a cavity block of the injection molding die which includes a stationary mold having first and second cavity halves of different shapes and a movable mold having first and second cavity halves opposed to those of the stationary mold so as to form the first and second cavities, and inserting the component part to be sealed in the first cavity while shifting a primarily molded piece from the first cavity to the second cavity so as to simultaneously form a primary molded piece and a secondary molded piece in one molding shot.

Each time the molding shot is performed, the component part to be sealed is inserted into the first cavity, and at the same time, the primary molded piece which has been formed in the first cavity is transferred to the second cavity. Then, the primary molding and secondary molding are concurrently carried out to form the primary molded piece in the first cavity and the secondary molded piece in which the primary molded piece is enclosed with resin material in the second cavity at one time. The molding shot in which the primary molded piece obtained in the first cavity is transferred to the second cavity while taking out the secondary molded piece from the second cavity is repeated to continuously produce the molded articles.

The present invention further provides an injection molding method for producing resin-sealed articles, in which, upon inserting a component part to be sealed into the first molding cavity just before injecting resin material into the first molding cavity, the primary molding is effected in the first molding cavity to form the primary molded piece, and then, the primary molded piece is transferred from the first molding cavity to the second molding cavity while being turned over, and at the same time, another component part to be sealed is inserted into the first molding cavity, which is vacant, to perform the primary molding in the first molding cavity simultaneously with the secondary molding in the second molding cavity.

The invention still more provides a method for continuously producing the molded articles, in which primary molding is carried out by injecting resin material into the first cavity to form a primary molded piece, and simultaneously, allowing resin material different from that injected into the first cavity to be injected into a second cavity so as to form upper and lower layers different in materials on the respective upper and lower surfaces of a component part to be sealed.

The injection molding method for producing resin-sealed molded articles according to the present invention comprises the following procedures (1)–(6):

(1) Primary molding process in which resin material is injected into a first cavity to form a primary molded piece, (2) Transferring process in which the primary molded piece formed in the first cavity is transferred to a second cavity, (3) Inserting process in which a component part to be sealed is inserted in the second cavity, (4) Concurrent primary and secondary molding process in which secondary molding for producing a secondary molded piece is effected by permitting the component part to be placed on the primary molded piece placed in the second cavity and sealed with resin material, and simultaneously, subsequent primary molding is effected to form a latest primary molded piece, (5) Removing and renewing process in which the secondary molded piece is released from the second cavity and the first molded piece is transferred to the second cavity, and (6) Running process for repeating the processes (3) to (5).

In the processes (3)–(5), after effecting the inserting process upon allowing the secondary molded piece concurrently formed to be taken out from the second cavity, the primary molded piece may be transferred to the second cavity.

In the inserting process effected after the transferring process, the component part to be sealed may be inserted onto the surface of the primary molded piece.

The resin materials to be injected into the respective first and second cavities may be of the same kind, or different in quality of material so as to form two different layers on the upper and lower surfaces of the component part.

Another injection molding method for producing resin-sealed molded articles according to this invention, comprises the following procedures (1)–(6):

(1) Primary molding process in which resin material is injected into a first cavity upon inserting a component part to be sealed in the first cavity, to form a primary molded piece, (2) Transferring process in which the primary molded piece formed in the first cavity is turned over and transferred to a second cavity, (3) Inserting process in which another component part to be sealed is inserted in the first cavity, which is vacant, (4) Concurrent primary and secondary molding process in which secondary molding is effected by injecting resin material into the second cavity to form a secondary molded pieces enclosing the component part, and simultaneously, subsequent primary molding is effected upon inserting another component part to be sealed into the first cavity, (5) Removing and renewing process in which the secondary molded piece is released from the second cavity and the first molded piece is transferred to the second cavity, and (6) Running process for repeating the processes (3) to (5).

In the processes (3)–(5), after effecting the inserting process upon allowing the secondary molded piece concurrently formed to be taken out from the second cavity, the primary molded piece may be transferred to the second cavity.

The resin materials to be injected into the respective first and second cavities may be of the same kind, or different in qualities of the materials so as to form two different layers on the upper and lower surfaces of the component part.

The present invention further provides an injection molding die for producing resin-sealed molded articles, which comprises stationary and movable split molds between which first and second molding cavities are defined for use in primary molding and secondary molding to form a packaged molded article having a component part such as a printed-circuit board sealed with resin material, first- and second-molding split cavity portions different in shape, which are secured onto the stationary split mold, and first and second common split cavity portions having the same shape, which are secured onto the movable split mold and opposite to the first and second split cavity portions secured onto the stationary split mold. Into the aforementioned two molding cavities, resin material can be injected by an injection unit disposed opposite to the stationary mold. The first molding cavity is defined by the opposed first split cavity portion and first and second common split cavity portions. The second molding cavity is defined by the opposed second split cavity portion and first and second common split cavity portions.

For rotating the movable mold, a turning table may be disposed.

The injection unit may be of a single-head type or a twin-head type. In the twin-head type, the first molding cavity can be filled with resin material supplied from a first injection unit, and second molding cavity can be filled with resin material supplied from a second injection unit.

Additionally, the present invention provides an electronically detectable indicator obtained as a molded article sealed with resin material by using the injection molding method of the invention. The indicator is produced in such a manner that a substrate member such as a printed board (including a flexible plate) having a resonant tag structure on which one or more resonant circuits operatable with electromagnetic wave of a specific frequency are formed is entirely sealed with resin material. In use, the indicator is attached to the bottom of a receptacle, so as to recognize contents in the receptacle or read out the price of a commodity for facilitating accounting management. Thus, the electronically detectable indicator of the invention can be effectively used as an information input source.

The electronically detectable indicator according to this invention is produced in the form of a resin-sealed molded article by the injection molding method of the invention and has a resonant tag structure on which one or more resonant circuits operatable with electromagnetic wave of a specific frequency are formed, and packaged by being entirely sealed with resin material. The indicator having a function of indicating positional information in resonant response to a signal having a specific frequency emitted from a transmitter can be used as a substitute for studded paving blocks to aid visual handicapped people.

The aforementioned "sheet-like" shape is by no means limited to a plane form, and comprehends a shape having a curved surface (arc-shaped surface and partially spherical surface).

Other and further objects of this invention will become obvious upon an understanding of the illustrative embodiments about to be described or will be indicated in the appended claims, and various advantages not referred to herein will occur to one skilled in the art upon employment of the invention in practice.

DESCRIPTION OF THE PREFERRED EMBODIMENTS

Figure 1:
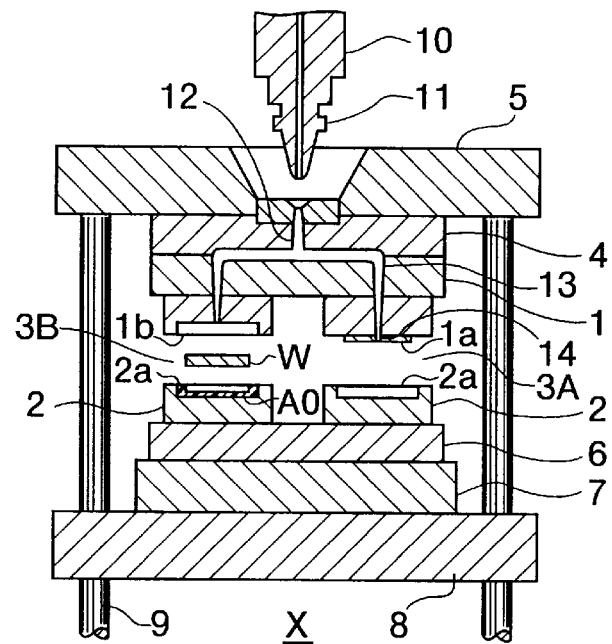
FIG. 1 is a sectional view showing the injection molding die assembled with a single-head type injection unit for carrying out the injection molding method of the present invention in the state of an inserting process after a primary molding process and a transferring process in a first embodiment of the invention.

An injection molding system having a single-head injection unit 10 for carrying out the injection molding method of the present invention comprises an injection molding die X having a pair of split molds defining first and second molding cavities and including gates, runners and sprue, as shown in FIG. 1 through FIG. 4. According to this system, primary and secondary molded pieces are simultaneously formed shot by shot except the first molding shot by undergoing the procedures (1)–(6) mentioned below. The molded article A resultantly formed is taken out each time the molding shot is finished.

The injection molding method of the invention comprises:

(1) effecting primary molding by use of a first cavity (primary molding process), (2) transferring a primary molded piece formed in the first cavity by the primary molding process to a second cavity (transferring process), (3) placing a component part W to be sealed onto the primary molded piece (inserting process), (4) subjecting the primary molded piece to secondary molding in the second cavity, and simultaneously carrying out the subsequent primary molding in the first cavity (concurrent primary and secondary molding process), (5) removing the secondary molded piece from the second cavity and transferring the first molded piece from the first cavity to the second cavity, upon carrying out the process (4) (removing and renewing process), and (6) repeating the processes (3) to (5) (running process).

In the foregoing processes, the inserting process may be effected just before injecting resin material in a first injection process, as shown in FIGS. 5 to 8. That is, the following processes (i) to (vi) may be performed.

(i) effecting primary molding upon placing a component part W to be sealed in a first cavity (primary molding process), (ii) allowing a primary molded piece formed in the first cavity by the primary molding process to be turned over and transferred to a second cavity (transferring process), (iii) inserting another component part W to be sealed in the first cavity, which is vacant (inserting process), (iv) subjecting the primary molded piece to secondary molding in the second cavity, and simultaneously carrying out the subsequent primary molding in the first cavity (concurrent primary and secondary molding process), (v) removing the secondary molded piece A from the second cavity and transferring the first molded piece from the first cavity to the second cavity, (removing and renewing process), and (vi) repeating the processes (iii) to (v) (running process).

There may be adopted a twin-head injection type system comprising an injection molding die Y having a pair of split molds defining first and second molding cavities and first and second injection units 21 and 22, as shown in FIG. 9 to FIG. 12. According to this system, primary and secondary molded pieces are simultaneously formed shot by shot except the first molding shot by undergoing the procedures (A)–(F) mentioned below.

(A) effecting primary molding by injecting resin material from the first injection unit into only a first cavity (primary molding process), (B) transferring a primary molded piece formed in the first cavity by the primary molding process to a second cavity (transferring process), (C) placing a component part W to be sealed onto the primary molded piece (inserting process), (D) effecting subsequent primary molding by injecting resin material from the first injection unit into the first cavity, and simultaneously effecting secondary molding by injecting resin material from the second injection unit into a second cavity (concurrent primary and secondary molding process), (E) removing the secondary molded piece A from the second cavity and transferring the first molded piece from the first cavity to the second cavity (removing and renewing process), and (F) repeating the processes (C) to (E) (running process).

In the foregoing processes, the inserting process may be effected just before injecting resin material in a first injection process, as illustrated in FIGS. 13 to 16. That is, the following processes (a) to (f) may be performed.

(a) effecting primary molding by injecting resin material from the first injection unit into only a first cavity upon inserting a component part to be sealed into the first cavity (primary molding process), (b) allowing a primary molded piece formed in the first cavity by the primary molding process to be turned over and transferred to a second cavity (transferring process), (c) inserting another component part to be sealed in the first cavity, which is vacant (inserting process), (d) subjecting the primary molded piece to secondary molding in the second cavity, and simultaneously carrying out the subsequent primary molding in the first cavity by simultaneously injecting molten resin material R from the respective first and second injection units 21 and 22 into the first and second cavities (concurrent primary and secondary molding process), (e) removing the secondary molded piece A from the second cavity and transferring the first molded piece from the first cavity to the second cavity, (removing and renewing process), and (f) repeating the processes (c) to (e) (running process).

In the single-head type injection molding system, the injection molding die X is provided with gates, runners and a sprue connected to the runners and gates formed in the stationary mold in the cavity block.

In the twin-head type injection molding system, the injection molding die Y has the first injection unit 21 and second injection unit 22 opposed to the stationary mold in the cavity block.

As the case may be, the stationary mold is secured onto a stationary plate and a stationary table, and the movable mold is secured onto a movable plate and a turning or movable table, if need arises.

Incidentally, the turning table becomes necessary where the primary molded piece must be turned over when being transferred from the first cavity to the second cavity.

A plurality of molding split cavity portions may be circumferentially arranged at positions to which a circumference on the movable mold is divided equally by an even number, preferably 2, 4, 6 or 8, so that the transferring of the molded pieces can be performed by use of the counterpart cavity portions.

Figure 17:
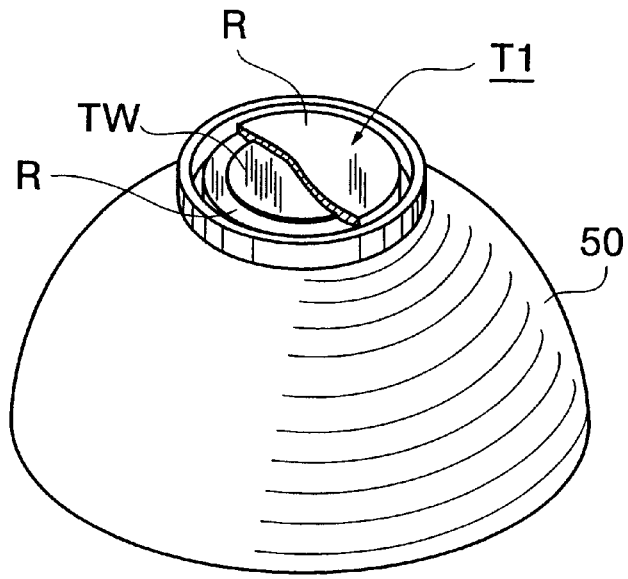
FIG. 17 is a partial cutaway perspective view of one embodiment of the sheet-like indicator of the invention in the state attached as an information input source to tableware.

An electronically detectable sheet-like indicator produced by the injection molding method of the present invention is attached to the bottom of a bowl or cup 50 as shown in FIG. 17, so as to be used as an information input source T1 such as a price tag of a commodity for facilitating accounting management.

Figure 18:
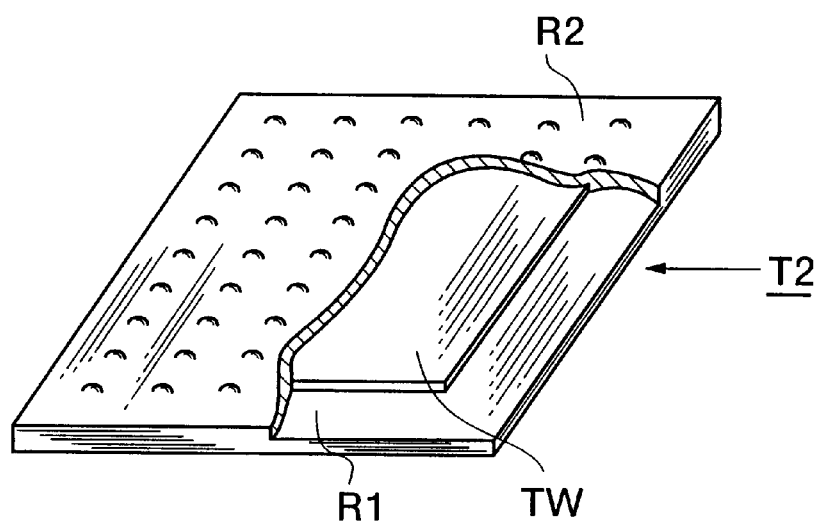
FIG. 18 is a partial cutaway perspective view of another embodiment of the sheet-like indicator of the invention, which is used as a studded paving block.

Another embodiment of the electronically detectable sheet-like indicator according to the invention is shown in FIG. 18, which can be used as a studded paving block T2 to aid visual handicapped people. This indicator has a function of indicating positional information in resonant response to a signal having a specific frequency emitted from a transmitter.

EMBODIMENTS

The embodiments 1 to 4 shown in FIGS. 1 through 16 serve to fulfill the injection molding methods described above according to the present invention, and the embodiments 5 and 6 are relevant to the electronically detectable sheet-like indicator of the invention.

Prior to describing these embodiments in detail, the outlines of the embodiments will be given.

The embodiments 1 and 2 are both concerned with a single-head type injection molding method, but different in molding process from each other. That is, the component part to be sealed is inserted after the primary molding process in the embodiment 1, but before the primary molding process in the embodiment 2.

The embodiments 3 and 4 are both concerned with a twin-head type injection molding method, but different in molding process from each other. That is, the component part to be sealed is inserted after the primary molding process in the embodiment 3, but before the primary molding process in the embodiment 4.

The embodiments 5 and 6 are both concerned with the electronically detectable sheet-like indicator, but different in usage. The indicator of the embodiment 5 is used for tableware, and that of the embodiment 6 is used as a studded paving block to aid visual handicapped people.

Embodiment 1

The embodiment of the injection molding method (including the injection molding die) according to the invention will be described with reference to FIG. 1 to FIG. 4.

The injection unit in this embodiment is of a single-head type. In this embodiment, the inserting process is effected after the primary molding process.

FIG. 1 is a sectional view of the injection molding die in the inserting process after the primary molding process and the transferring process.

Figure 2:
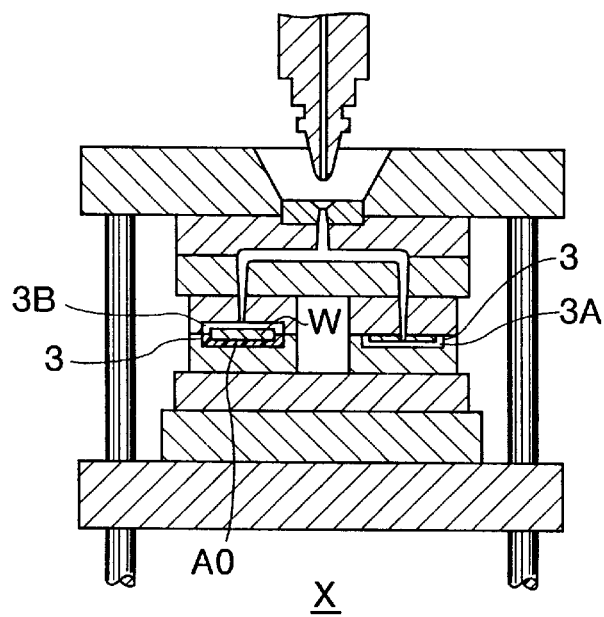
FIG. 2 is a sectional view showing the injection molding die of the first embodiment of the invention in the state of a concurrent primary and secondary molding process (mold clamping before injecting resin material).

FIG. 2 shows the concurrent primary and secondary molding process (mold clamping state before injecting resin material).

Figure 3:
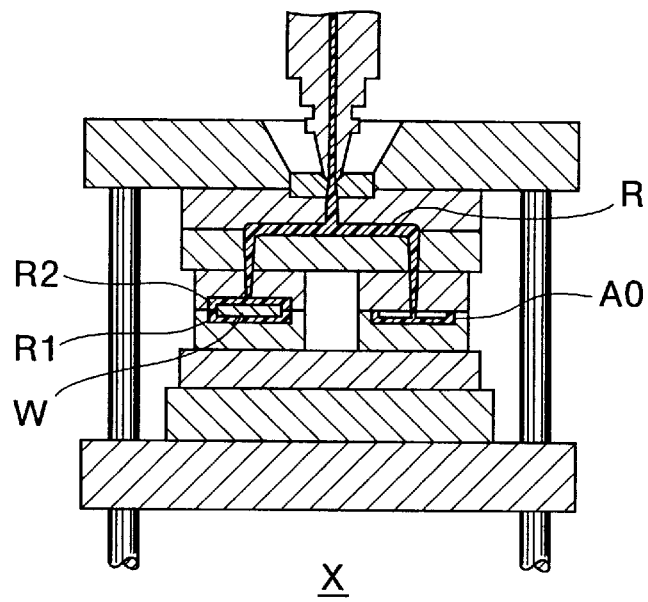
FIG. 3 is a sectional view showing the injection molding die of the first embodiment of the invention in the state of a concurrent primary and secondary molding process (resin injecting and dwelling after injecting resin material).

FIG. 3 shows the concurrent primary and secondary molding process (resin injecting and dwelling state after injecting resin material).

Figure 4:
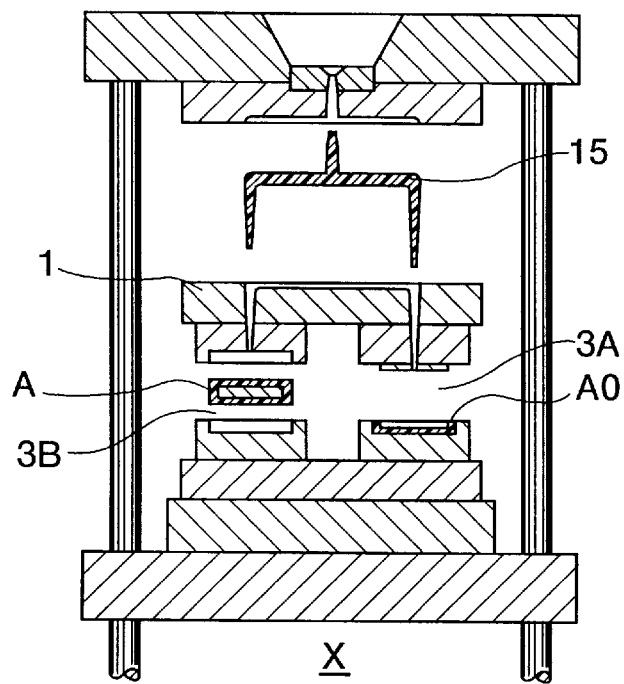
FIG. 4 is a sectional view showing the injection molding die of the first embodiment of the invention in the state of a removing and renewing process.

FIG. 4 shows the removing and renewing process.

In the drawings, reference numeral 1 denotes the stationary mold, 1a the first-molding split cavity portion, 1b the second-molding split cavity portion, 2 the movable mold, 2a split cavity portion for commonly first- and second-molding, 3 the cavity, 3A the first molding cavity, 3B the second molding cavity, 4 the stationary plate, 5 the stationary platen, 6 the movable plate, 7 the turning table, 8 the movable platen, 9 tie-bars, 10 the injection unit (single-head type), 11 a nozzle, 12 the sprue, 13 the runners, 14 the gates, 15 hardened resin in the runner, R resin material (thermoplastic resin), R1 a primary resin (molded layer), R2 a secondary resin (molded layer), W the component part to be sealed, X the injection molding die, A0 the primary molded piece, and A the resin-sealed molded article (secondary molded piece).

As illustrated, the injection unit 10 in this embodiment is of a single-head type. The cavity block in the injection molding die X having the first and second molding cavities 3A and 3B formed in the paired split molds mainly comprises the stationary mold 1 formed of the first- and second-molding split cavity portions 1a and 1b different in shape, and the movable mold 2 having at least two first and second common split cavity portions 2a opposite to the cavity portions of the stationary mold.

In addition, the injection molding die X includes the stationary plate 4 and stationary platen 5, which are united to the stationary mold 1, and the movable plate 6, turning table 7 and movable platen 8, which are united to the movable mold 2. The injection molding die X further has the gates 14, sprue 12 and runners 13 connected to the cavities 3A and 3B, and the single-head injection unit 10.

The injection molding is fulfilled by using the aforementioned molding die X in the manner (molding procedure) as described below. In short, the primary molded piece A0 and the secondary molded piece A are concurrently formed shot by shot except the first molding shot, and then, the resin-sealed molded article A is taken out from the mold.

The description of the procedure of mold opening and clamping will be omitted in part.

First, the primary molding (injection) is effected in the first cavity 3A (primary molding process as seen in FIG. 1 and FIG. 2), and then, the primary molded piece A0 is transferred to the second cavity 3B (transferring process).

The transferring process is not concretely shown in the drawings.

Thereafter, the component part W to be sealed is placed on the primary molded piece A0 as shown in FIG. 1 (inserting process).

As a countermeasure, the inserting process may be effected before the transferring process.

After the inserting process, the primary molded piece A0 is subjected to the secondary molding in the second cavity 3B, and simultaneously, the subsequent primary molding is effected in the first cavity 3A as shown in FIG. 2 and FIG. 3 (concurrent primary and secondary molding process).

After the concurrent primary and secondary molding process, the secondary molded piece A thus obtained is removed, and simultaneously, a primary molded piece A0 newly formed is transferred to the second cavity 3B, which is vacant as shown in FIG. 4 (removing and renewing process).

Thereafter, the aforementioned inserting process, concurrent primary and secondary molding process, and removing and renewing process are repeated (running process).

The procedure for producing the resin-sealed molded article by the injection molding method of this embodiment will be summarized hereinbelow.

| | |
|---|---|
| Step 1: | Mold clamping |
| Step 2: | Primary injection |
| Step 3: | Primary filling (dwelling) |
| Step 4: | Cooling |
| Step 5: | Mold opening |
| Step 6 (7): | Transferring of molded piece |
| Step 7 (6): | Inserting |
| Step 8: | Mold clamping |
| Step 9: | Primary and secondary injection |
| Step 10: | Primary and secondary filling (dwelling) |
| Step 11: | Cooling |
| Step 12: | Mold opening |
| Step 13 (14): | Transferring of molded parts |
| Step 14 (13): | Inserting and removal of secondary molded pieces |
| Step 15: | (Quiescent time) |
| Step 16 and thereafter: | Repeating of steps 8–14 (15) |

The steps 6 and 7, and steps 13 and 14 respectively may be reversed. The step 15 is optional.

The molding split cavity portions 2a of the movable mold 2 may be circumferentially arranged at positions to which a circumference on the movable mold is divided equally by 2, 4, 6 or 8. In this structure, the primary molding is first effected by use of the split cavity portions 2a in pair, and thereafter, the split cavity portions 2a are changed in position by rotating the movable mold 2 upon mold-opening, thus to transfer the primary molded piece to the cavity for secondary molding.

Embodiment 2

The second embodiment of the injection molding method (including the injection molding die) according to the invention will be described with reference to FIG. 5 to FIG. 8.

The injection unit in this embodiment is of a single-head type. In this embodiment, the inserting process is effected before the primary molding process.

Figure 5:
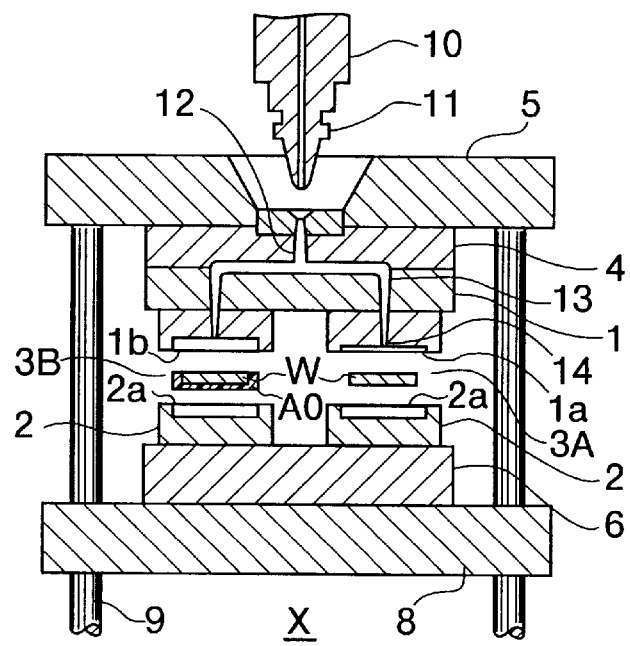
FIG. 5 is a sectional view showing the injection molding die assembled with a single-head type injection unit for carrying out the injection molding method of the present invention in the state of an inserting process after a primary molding process and a transferring process in a second embodiment of the invention.

FIG. 5 is a sectional view of the injection molding die in the inserting process after the primary molding process and the transferring process in the second embodiment.

Figure 6:
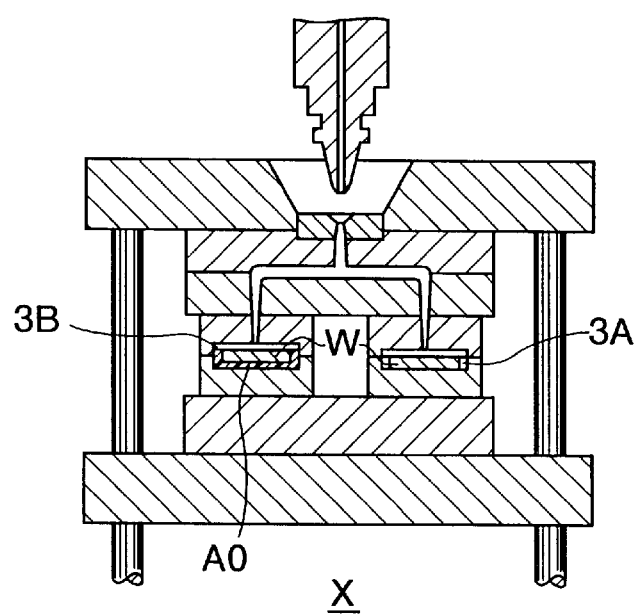
FIG. 6 is a sectional view showing the injection molding die of the second embodiment of the invention in the state of a concurrent primary and secondary molding process (mold clamping before injecting resin material).

FIG. 6 shows the concurrent primary and secondary molding process (mold clamping state before injecting resin material).

Figure 7:
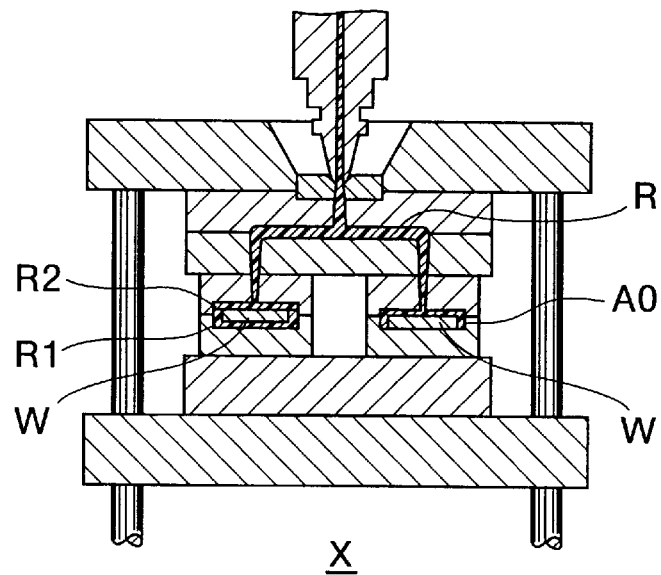
FIG. 7 is a sectional view showing the injection molding die of the second embodiment of the invention in the state of a concurrent primary and secondary molding process (resin injecting and dwelling after injecting resin material).

FIG. 7 shows the concurrent primary and secondary molding process (resin injecting and dwelling state after injecting resin material).

Figure 8:
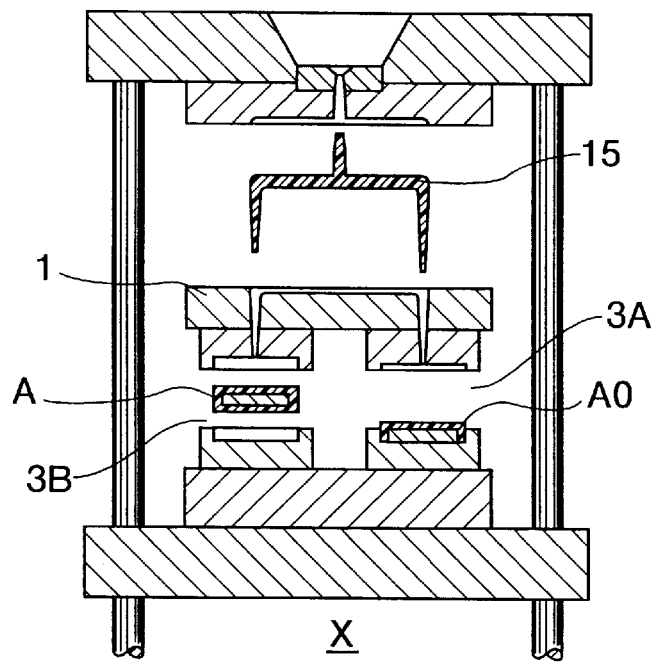
FIG. 8 is a sectional view showing the injection molding die of the second embodiment of the invention in the state of a removing and renewing process.

FIG. 8 shows the removing and renewing process.

As shown in these drawings, the injection unit 10 in Embodiment 2 is of a single-head type. The injection molding die X in this embodiment is substantially the same as that in Embodiment 1 described above, and comprises the united stationary mold 1, stationary plate 4 and stationary platen 5, and the united movable mold 2, movable plate 6 and movable platen 8. The injection molding die X in the illustrated embodiment is not provided with the turning table 7 as seen in FIG. 1.

The injection molding in this embodiment is fulfilled, to sum up, by simultaneously forming the primary molded piece A0 and the secondary molded piece A shot by shot except the first molding shot, and then, taking out the resin-sealed molded article A from the mold.

The molding procedure of this embodiment will be described hereinafter.

First, the primary molding is effected upon inserting a component part to be sealed into the first cavity 3A (primary molding process as seen in FIG. 5 and FIG. 6), and then, the primary molded piece A0 thus obtained is turned over and transferred to the second cavity 3B (transferring process).

The transferring process is not concretely shown in the drawings.

Thereafter, another component part W to be sealed is inserted into the first cavity 3A, which is vacant as shown in FIG. 5 (inserting process).

In the subsequent injection process, the primary molded piece A0 is subjected to the secondary molding in the second cavity 3B, and simultaneously, the subsequent primary molding is effected in the first cavity 3A as shown in FIG. 6 and FIG. 7 (concurrent primary and secondary molding process).

After the concurrent primary and secondary molding process, the secondary molded piece A thus obtained is removed, and simultaneously, a primary molded piece A0 newly formed is transferred to the second cavity 3B, which is vacant as shown in FIG. 8 (removing and renewing process).

Thereafter, the aforementioned inserting process, concurrent primary and secondary molding process, and removing and renewing process are repeated (running process).

The procedure for producing the resin-sealed molded article by the injection molding method of this embodiment will be summarized hereinbelow.

| | |
|---|---|
| Step 0: | Inserting |
| Step 1: | Mold clamping |
| Step 2: | Primary injection |
| Step 3: | Primary filling (dwelling) |
| Step 4: | Cooling |
| Step 5: | Mold opening |
| Step 6: | Transferring of molded piece |
| Step 7: | Inserting |
| Step 8: | Mold clamping |
| Step 9: | Primary and secondary injection |
| Step 10: | Primary and secondary filling (dwelling) |
| Step 11: | Cooling |
| Step 12: | Mold opening |
| Step 13 (14): | Transferring of molded pieces |
| Step 14 (13): | Inserting and removal of secondary molded piece |
| Step 15: | (Quiescent time) |
| Step 16 and thereafter: | Repeating of steps 8–14 (15) |

This embodiment proves advantageous from adherence of the component part W to be sealed to the resin material R. The steps 13 and 14 may be reversed. The step 15 is optional.

In the cavity transferring step in which the component part W to be sealed is inserted into the first molding cavity 3A, the split cavity portion 2a of the movable mold 2 may preferably be provided with positioning means such as a groove conforming to the shape of the component part W in order to facilitate placing of the component part in position and improve workability.

Also in this embodiment, the injection molding die may be provided with a turning table as indicated by 7 in FIG. 1. However, since the primary molded piece A0 formed in this embodiment is turned over, such a turning table is not absolutely necessary to this embodiment.

Similarly to Embodiment 1 described above, the molding split cavity portions 2a of the movable mold 2 may be circumferentially arranged at positions to which a circumference on the movable mold is divided equally by 2, 4, 6 or 8. In this structure, the primary molding is first effected by use of the split cavity portions 2a in pair, and thereafter, the split cavity portions 2a are changed in position by rotating the movable mold 2 upon mold-opening, thus to transfer the primary molded piece to the cavity for secondary molding.

Embodiment 3

The third embodiment of the injection molding method (including the injection molding die) according to the invention will be described with reference to FIG. 9 to FIG. 12.

The injection unit in this embodiment is of a twin-head type. In this embodiment, the inserting process is effected after the primary molding process.

In the drawings, reference numeral 20 denotes the twin-head injection unit having the first unit 21 and the second unit 22. The injection molding die is indicated by Y. The other elements constituting the injection molding die Y are depicted by the same reference symbols with respect to those of Embodiment 1 described above.

Figure 9:
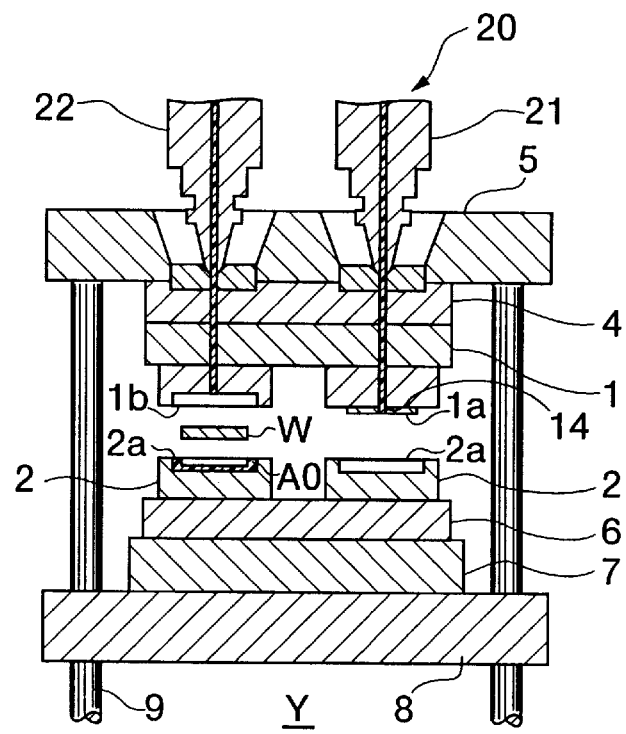
FIG. 9 is a sectional view showing the injection molding die assembled with a twin-head type injection unit for carrying out the injection molding method of the present invention in the state of an inserting process after a primary molding process and a transferring process in a third embodiment of the invention.

FIG. 9 is a sectional view of the injection molding die in the inserting process after the primary molding process and the transferring process.

Figure 10:
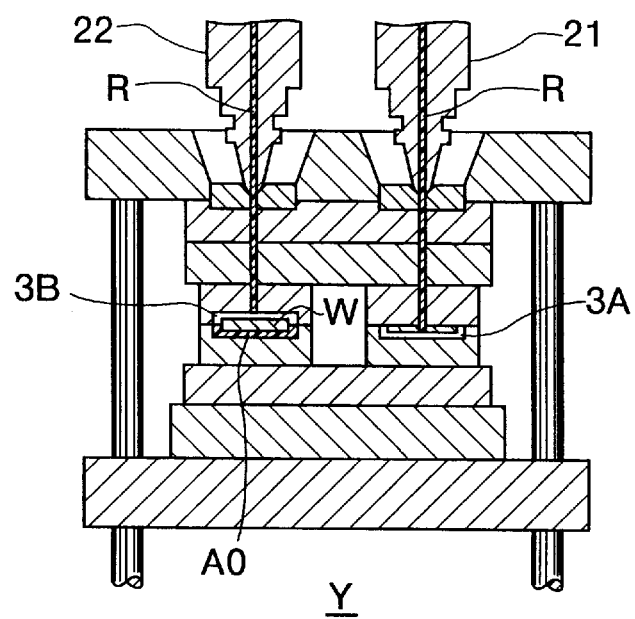
FIG. 10 is a sectional view showing the injection molding die of the third embodiment of the invention in the state of a concurrent primary and secondary molding process (mold clamping before injecting resin material).

FIG. 10 shows the concurrent primary and secondary molding process (mold clamping state before injecting resin material).

Figure 11:
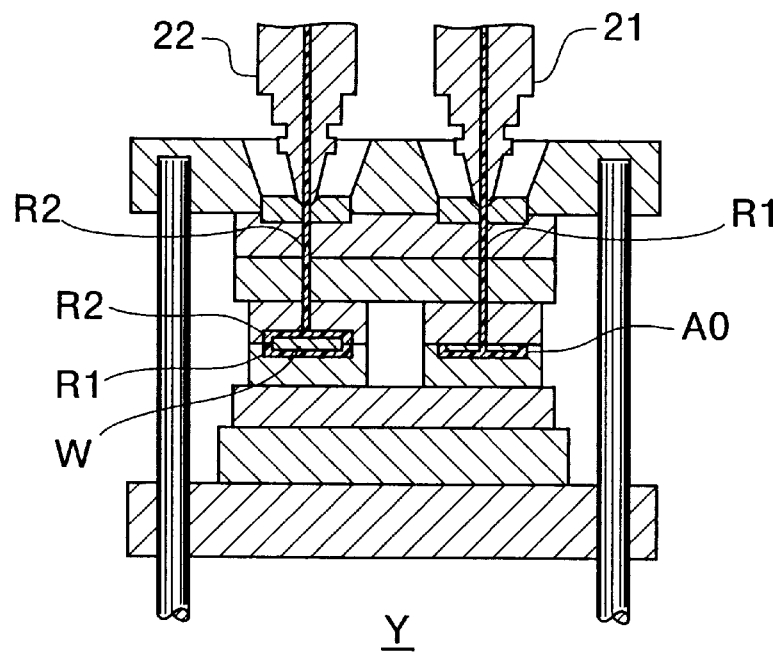
FIG. 11 is a sectional view showing the injection molding die of the third embodiment of the invention in the state of a concurrent primary and secondary molding process (resin injecting and dwelling after injecting resin material).

FIG. 11 shows the concurrent primary and secondary molding process (resin injecting and dwelling state after injecting resin material).

Figure 12:
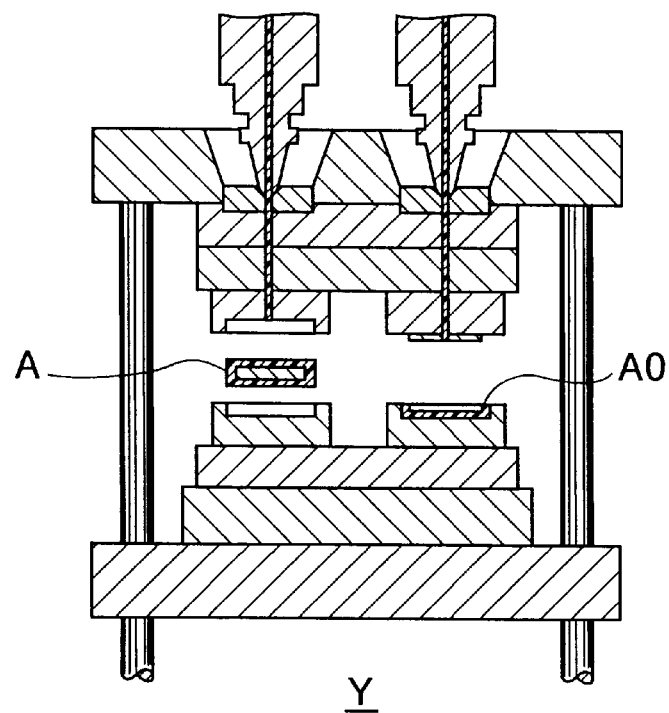
FIG. 12 is a sectional view showing the injection molding die of the third embodiment of the invention in the state of a removing and renewing process.

FIG. 12 shows the removing and renewing process.

As shown in these drawings, the injection unit 20 in Embodiment 2 is of a twin-head type. The injection molding die Y in this embodiment has the same elements as those in Embodiments 1 and 2 described above, and comprises the united stationary mold 1, stationary plate 4 and stationary platen 5, and the united movable mold 2, movable plate 6 and movable platen 8. The first injection unit 21 for the cavity 3A and the second injection unit 22 for the cavity 3B are opposed to on the stationary mold 1.

The injection molding in this embodiment is fulfilled, to sum up, by simultaneously forming the primary molded piece A0 and the secondary molded piece A shot by shot except the first molding shot, and then, taking out the resin-sealed molded article A from the mold.

The procedure (molding steps) of this embodiment will be described hereinafter.

First, the primary molding is effected by injecting molten resin material R into only the first cavity 3A by use of the first injection unit 21 (primary molding process as seen in FIG. 9 and FIG. 10), and then, the primary molded piece A0 resultantly obtained is transferred to the second cavity 3B (transferring process).

The transferring process is not concretely shown in the drawings.

Thereafter, a component part W to be sealed is placed on the primary molded piece A0 as shown in FIG. 9 (inserting process).

As a countermeasure, the inserting process may be effected before the transferring process.

After the inserting process, molten resin material R is injected into the respective first and second molding cavities 3A and 3B from the first and second injection units 21 and 22 as shown in FIG. 10 and FIG. 11, so that the second molding is effected for producing the primary molded piece A0 in the second cavity 3B, and simultaneously, the subsequent primary molding is effected in the first cavity 3A (concurrent primary and secondary molding process).

Then, the secondary molded piece A thus obtained is removed, and simultaneously, a primary molded piece A0 newly formed is transferred to the second cavity 3B, which is vacant as shown in FIG. 12 (removing and renewing process).

Thereafter, the aforementioned inserting process, concurrent primary and secondary molding process, and removing and renewing process are repeated (running process).

The procedure for producing the resin-sealed molded article by the injection molding method of this embodiment will be summarized hereinbelow.

| | |
|---|---|
| Step 1: | Mold clamping |
| Step 2: | Primary injection |
| Step 3: | Primary filling (dwelling) |
| Step 4: | Cooling |
| Step 5: | Mold opening |
| Step 6 (7): | Transferring of molded piece |
| Step 7 (6): | Inserting |
| Step 8: | Mold clamping |
| Step 9: | Primary and secondary injection |
| Step 10: | Primary and secondary filling (dwelling) |
| Step 11: | Cooling |
| Step 12: | Mold opening |
| Step 13 (14): | Transferring of molded pieces |
| Step 14 (13): | Inserting and removal of secondary molded piece |
| Step 15: | (Quiescent time) |
| Step 16 and thereafter: | Repeating of steps 8–14 (15) |

The steps 13 and 14 may be reversed. The step 15 is optional.

The resin material R is thermoplastic resin. In the primary and secondary processes, the resin material to be supplied from the first injection unit may be different from that from the second injection unit, so as to form upper and lower layers different in material on the respective upper and lower surfaces of the component part W to be sealed. In the embodiment of FIG. 11, primary resin material R1 is supplied from the first injection unit 21, and simultaneously, secondary resin material R2 is supplied from the second injection unit 22, to form different resin layers on the upper and lower surfaces of the component part W to be sealed.

It is needless to say that the primary resin material R1 may be the same as the secondary resin material R2.

Also in this embodiment, the molding split cavity portions 2a of the movable mold 2 may be circumferentially arranged at positions to which a circumference on the movable mold is divided equally by 2, 4, 6 or 8, similarly to Embodiment 1 described above. In this structure, the primary molding is first effected by use of the split cavity portions 2a in pair, and thereafter, the split cavity portions 2a are changed in position by rotating the movable mold 2 upon mold-opening, thus to transfer the primary molded piece to the cavity for secondary molding.

Embodiment 4

The fourth embodiment of the injection molding method according to the invention will be described with reference to FIG. 13 to FIG. 16.

The injection unit in this embodiment is of a twin-head type. In this embodiment, the inserting process is effected before the primary molding process.

Figure 13:
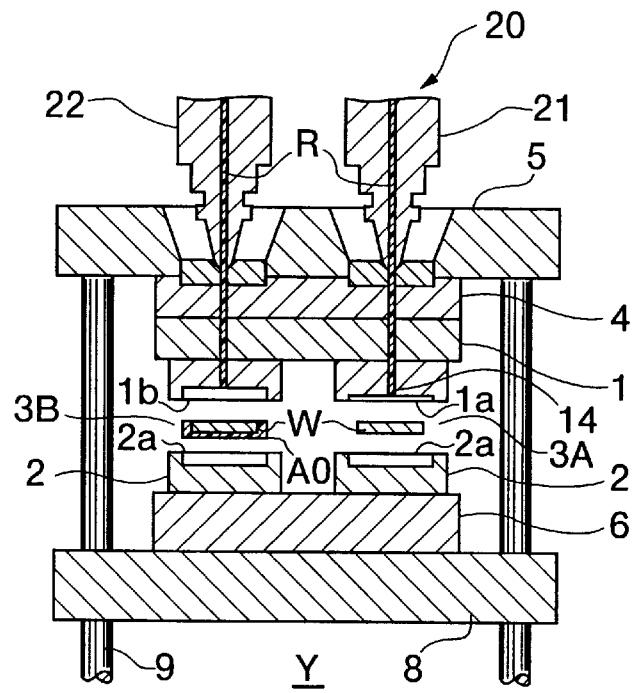
FIG. 13 is a sectional view showing the injection molding die assembled with a twin-head type injection unit for carrying out the injection molding method of the present invention in the state of an inserting process after a primary molding process and a transferring process in a fourth embodiment of the invention.

FIG. 13 is a sectional view of the injection molding die in the inserting process after the primary molding process and the transferring process in the fourth embodiment.

Figure 14:
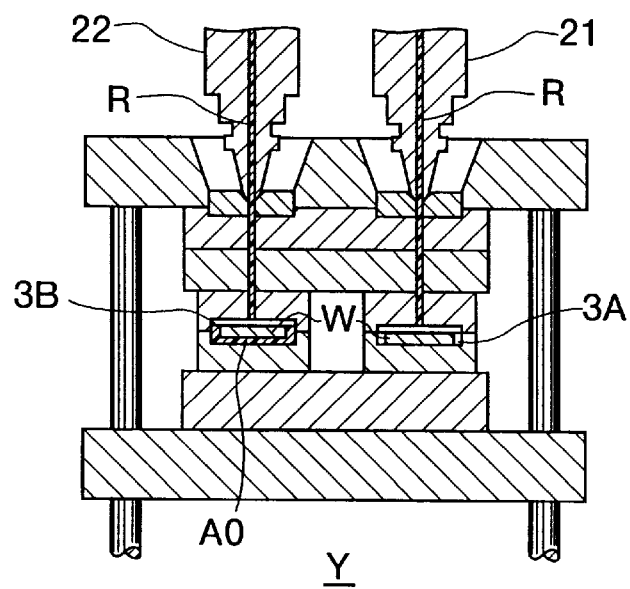
FIG. 14 is a sectional view showing the injection molding die of the fourth embodiment of the invention in the state of a concurrent primary and secondary molding process (mold clamping before injecting resin material).

FIG. 14 shows the concurrent primary and secondary molding process (mold clamping state before injecting resin material).

Figure 15:
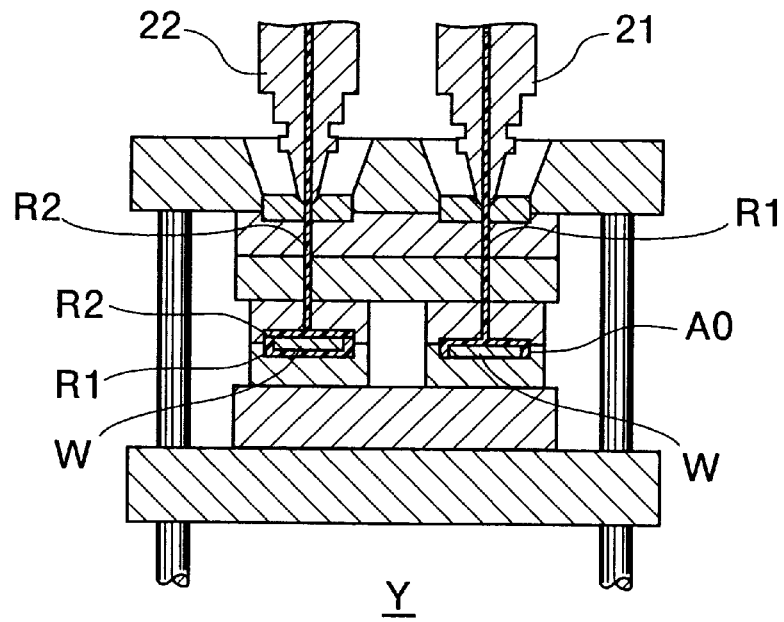
FIG. 15 is a sectional view showing the injection molding die of the fourth embodiment of the invention in the state of a concurrent primary and secondary molding process (resin injecting and dwelling after injecting resin material).

FIG. 15 shows the concurrent primary and secondary molding process (resin injecting and dwelling state after injecting resin material).

Figure 16:
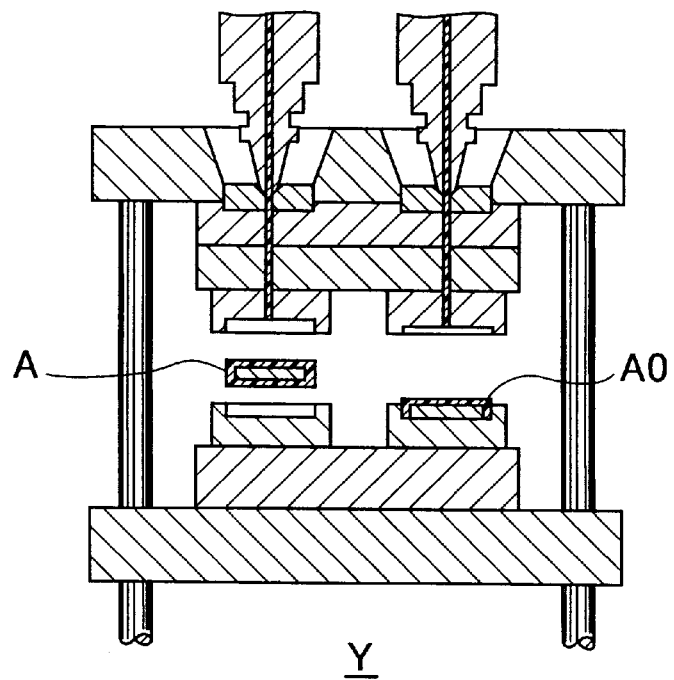
FIG. 16 is a sectional view showing the injection molding die of the fourth embodiment of the invention in the state of a removing and renewing process.

FIG. 16 shows the removing and renewing process.

As shown in these drawings, the injection unit 10 in this embodiment is of a twin-head type. The injection molding die Y in this embodiment is substantially the same as that in Embodiment 1 described above, and comprises the united stationary mold 1, stationary plate 4 and stationary platen 5, and the united movable mold 2, movable plate 6 and movable platen 8. The injection molding die Y in the illustrated embodiment is not provided with the turning table 7 as seen in FIG. 9.

The first injection unit 21 for the cavity 3A and the second injection unit 22 for the cavity 3B are opposed to on the stationary mold 1.

The injection molding in this embodiment is fulfilled, to sum up, by simultaneously forming the primary molded piece A0 and the secondary molded piece A shot by shot except the first molding shot, and then, taking out the resin-sealed molded article A from the mold.

The procedure (molding steps) of this embodiment by use of the aforesaid injection molding die Y will be described hereinafter.

First, the primary molding is effected upon inserting a component part W to be sealed into the first cavity 3A (primary molding process as seen in FIG. 13 and FIG. 14), and then, the primary molded piece A0 thus obtained is turned over and transferred to the second cavity 3B (transferring process).

Then, another component part W to be sealed is inserted into the first cavity 3A, which is vacant as shown in FIG. 13 (inserting process).

In the subsequent injection process, molten resin material R is injected into the respective first and second molding cavities 3A and 3B from the first and second injection units 21 and 22 as shown in FIG. 14 and FIG. 15, so that the second molding is effected on the primary molded piece A0 in the second cavity 3B, and simultaneously, the subsequent primary molding is effected in the first cavity 3A (concurrent primary and secondary molding process).

Then, the secondary molded piece A thus obtained is removed, and simultaneously, a primary molded piece A0 newly formed is transferred to the second cavity 3B, which is vacant as shown in FIG. 16 (removing and renewing process).

Thereafter, the aforementioned inserting process, concurrent primary and secondary molding process, and removing and renewing process are repeated (running process).

The procedure for producing the resin-sealed molded article by the injection molding method of this embodiment will be summarized hereinbelow.

| | |
|---|---|
| Step 0: | Inserting |
| Step 1: | Mold clamping |
| Step 2: | Primary injection |
| Step 3: | Primary filling (dwelling) |
| Step 4: | Cooling |
| Step 5: | Mold opening |
| Step 6: | Transferring of molded piece |
| Step 7: | Inserting |
| Step 8: | Mold clamping |
| Step 9: | Primary and secondary injection |
| Step 10: | Primary and secondary filling (dwelling) |
| Step 11: | Cooling |
| Step 12: | Mold opening |
| Step 13 (14): | Transferring of molded pieces |
| Step 14 (13): | Inserting and removal of secondary molded pieces |
| Step 15: | (Quiescent time) |
| Step 16 and thereafter: | Repeating of steps 8–14 (15) |

The steps 13 and 14 may be reversed. The step 15 is optional.

Also in this embodiment, the injection molding die may be provided with a turning table as indicated by 7 in FIG. 9, so as to perform the transferring of the molded piece by rotating the movable plate 6. However, since the primary molded piece A0 formed in this embodiment is turned over, such a turning table is not absolutely necessary to this embodiment.

Also in the embodiment of FIG. 15, primary resin material R1 is supplied from the first injection unit 21, and simultaneously, secondary resin material R2 is supplied from the second injection unit 22, to form different resin layers on the upper and lower surfaces of the component part W to be sealed.

It is needless to say that the primary resin material R1 may be the same as the secondary resin material R2.

Embodiment 5

The sheet-like indicator T1 in this embodiment is produced in the form of a resin-sealed molded article by the injection molding method of the invention and has a resonant tag structure TW packaged by being entirely sealed with resin material R, as shown in FIG. 17. The resonant tag structure TW is formed by printing one or more resonant circuits operatable with electromagnetic wave of a specific frequency on a board or substrate. In use, the sheet-like indicator T1 is attached to the bottom of the bowl or cup 50, so as to recognize contents in the bowl or read out the price of a commodity for facilitating accounting management. The sheet-like indicator T1 can also be used as an information input source for automatic accounting systems or automatic teller machines in cafeterias, restaurants and so on.

Embodiment 6

The sheet-like indicator T2 in this embodiment is produced in the form of a resin-sealed molded article by the injection molding method of the invention and has the same resonant tag structure TW as that of Embodiment 5 noted above, which is packaged by being entirely sealed with resin material layers R1 and R2, as shown in FIG. 17. The resin material layers R1 and R2 of the sheet-like indicator T2 in this embodiment are different, but may be made of the same material.

The sheet-like indicator T2 serves to indicate positional information in resonant response to a signal having a specific frequency emitted from a transmitter. The indicator T2 can be used as guiding tile blocks for indoor or outdoor use to build up a supplementary guide (navigation) system for aiding visual handicapped people.

The users of the guiding tile block are not limited only to the visual handicapped people. The guiding tile block of this type serves as an information source for old persons and their helpers in the present social life.

According to this invention, since the primary molded piece and the secondary molded piece (resin-sealed molded article) are produced at one time by inserting the component part to be sealed and transferring the molded piece in each molding shot, completely sealed molded articles in which a sheet-like component part such as a printed-circuit board is packaged can be produced shot by shot in succession.

Furthermore, according to this invention, the injection molding method can be made simple and mass-produce the resin-sealed molded articles at a high yield rate.

The effects brought about by the present invention will be concretely enumerated hereinafter:

(1) Although a sheet-like component part such as a printed-circuit board is easily damaged (fractured) under molding pressure in general, the present invention can prevent the component part from being damaged by being placed on the primary molded piece to disperse the molding pressure.

(2) The injection molding die according to this invention can easily be mounted on an ordinary general-purpose injection molding machine, thus to compose a producing system for molded articles at a low cost.

(3) According to this invention, since the component part to be sealed can be placed in position in the first molding cavity for performing the primary molding by forming positioning means such as a groove in the molding split cavity portion, workability and processability in producing the molded articles can be improved.

(4) According to this invention, electronically detectable sheet-like indicators each having a resonant tag which is obtained as the molded article produced by the molding method of the invention can be very effectively mass-produced.

It is to be understood that the invention is not limited in its application to the details of construction and arrangement of parts illustrated in the accompanying drawings, since the invention is capable of being practiced or carried out in various ways. Also it is to be understood that the phraselogy or terminology employed herein is for the purpose of description and not of limitation.

What is claimed is:

1. An injection molding method for producing resin-sealed articles, comprising:

injecting a resin material into a first molding cavity to form a primary molded piece in the first molding cavity, transferring said primary molded piece formed in the first molding cavity to a second molding cavity situated adjacent to the first molding cavity, disposing a printed circuit board to be sealed into the primary molded piece disposed in the second molding cavity, injecting the resin material into the first and second molding cavities at a same time to be filled by one injecting shot to thereby form a subsequent primary molded piece in the first molding cavity, and to form a secondary molded piece above the printed circuit board to thereby prepare a sealed printed circuit board completely covered by the primary and secondary molded pieces made of the same resin material, removing the sealed printed circuit board from the second molding cavity, transferring the subsequent primary molded piece in the first molding cavity to the second molding cavity, from which the sealed printed circuit board has been removed, and repeating steps of disposing a printed circuit board into the subsequent primary molded piece, injecting the resin material into the first and second molding cavities, removing the sealed printed circuit board and transferring a primary molded piece in the first molding cavity.

2. An injection molding method for producing resin-sealed articles, comprising:

disposing a printed circuit board to be sealed in a first molding cavity, injecting a resin material into the first molding cavity to form a primary molded piece containing the printed circuit board therein, transferring said primary molded piece with the printed circuit board formed in the first molding cavity to a second molding cavity situated adjacent to the first molding cavity, and disposing another printed circuit board to be sealed in the first molding cavity, injecting the resin material into the first and second molding cavities at a same time to be filled by one injecting shot to thereby form a subsequent primary molded piece in the first molding cavity, and to form a secondary molded piece above the component to thereby prepare a sealed printed circuit board completely covered by the primary and secondary molded pieces made of the same resin material, removing the sealed printed circuit board from the second molding cavity, and transferring the subsequent primary molded piece in the first molding cavity to the second molding cavity, from which the sealed printed circuit board has been removed, and repeating steps of disposing a printed circuit board into the first molding cavity, injecting the resin material into the first and second molding cavities, removing the sealed printed circuit board and transferring a primary molded piece in the first molding cavity.

* * * * *